(12) United States Patent
Luckner et al.

(10) Patent No.: US 7,230,831 B2
(45) Date of Patent: Jun. 12, 2007

(54) HEAT SINK FOR SURFACE-MOUNTED SEMICONDUCTOR DEVICES

(75) Inventors: Uwe Luckner, Bad Abbach (DE); Georg Ernst, Thalmassing (DE); Manuel Carmona, Barcelona (ES); Markus Fink, Zell (DE)

(73) Assignee: Infineon Technologies AG, Munich (DE)

( * ) Notice: Subject to any disclaimer, the term of this patent is extended or adjusted under 35 U.S.C. 154(b) by 121 days.

(21) Appl. No.: 11/118,778

(22) Filed: May 2, 2005

(65) Prior Publication Data

US 2006/0158857 A1 Jul. 20, 2006

(30) Foreign Application Priority Data

Jan. 20, 2005 (DE) .............. 10 2005 002 812

(51) Int. Cl.
    *H05K 7/20* (2006.01)
(52) U.S. Cl. ............... 361/719; 361/702; 361/704; 165/80.3; 257/713; 257/719; 174/16.3
(58) Field of Classification Search ........... 361/690, 361/697, 704, 707, 709–710, 719–720; 165/80.2, 165/80.3, 185; 174/16.3, 252; 257/706, 257/707, 712–713, 722–726, 727, 718–719; 248/505, 510; 24/295–296, 457–458; 428/40.5, 428/41.3, 41.8, 220, 348–349; 524/588, 524/430; 528/15, 31, 501
See application file for complete search history.

(56) References Cited

U.S. PATENT DOCUMENTS 4,822,560 A * 4/1989 Oyama et al. .............. 420/470

| 5,365,399 | A | * | 11/1994 | Kent et al. .................. 361/704 |
| 5,781,412 | A | * | 7/1998 | de Sorgo ..................... 361/704 |
| 5,893,409 | A | * | 4/1999 | Kohler et al. ............... 165/80.3 |
| 6,054,198 | A | * | 4/2000 | Bunyan et al. ............. 428/40.5 |
| 6,188,576 | B1 | | 2/2001 | Ali et al. |
| 6,208,517 | B1 | * | 3/2001 | Prince et al. ............... 361/704 |
| 6,233,150 | B1 | | 5/2001 | Lin et al. |

(Continued)

FOREIGN PATENT DOCUMENTS

DE  100 26 348 A1  11/2001

OTHER PUBLICATIONS

The Atricle: One Piece Snap On Heat Sink. IBM Technical Disclosure Bulletine, Lune 1979, vol. # 22, Issue # 1, pp. 71-72.*

*Primary Examiner*—Michael Datskovskiy
(74) *Attorney, Agent, or Firm*—Edell, Shapiro & Finnan, LLC (57) ABSTRACT

A heat sink is arranged on a main circuit board of an electronic module. The heat sink includes a three-dimensionally structured thermally conductive plate with a press-on region and with snap-action hooks. The snap-action hooks are arranged approximately at right angles with respect to the press-on region and are resiliently connected to the press-on region. The snap-action hooks are latched into place, with pressure generation of the press-on region onto a rear side of a surface-mountable semiconductor device, into corresponding passage openings of the circuit board. A plastically deformable thermal composition is disposed between the rear side of the semiconductor device and the press-on region of the heat sink so as to form an intermediate layer therebetween to provide compensation for the thickness tolerances of the semiconductor device.

19 Claims, 6 Drawing Sheets

U.S. PATENT DOCUMENTS 6,444,496 B1 * 9/2002 Edwards et al. ............ 438/122
7,119,143 B2 * 10/2006 Jarnjevic et al. ............ 524/588
2003/0128521 A1 7/2003 Matayabas, Jr. et al.
2004/0264135 A1 12/2004 MacGregor

* cited by examiner

HEAT SINK FOR SURFACE-MOUNTED SEMICONDUCTOR DEVICES

CROSS REFERENCE TO RELATED APPLICATIONS

This application claims priority under 35 U.S.C. §119 to German Application No. DE 10 2005 002 812.8, filed on Jan. 20, 2005, and titled "Heat Sink for Surface-Mounted Semiconductor Devices and Mounting Method," the entire contents of which are hereby incorporated by reference.

FIELD OF THE INVENTION

The invention relates to a heat sink for surface-mounted semiconductor devices on a main circuit board of an electronic module, and a mounting method for the same.

BACKGROUND

U.S. Pat. No. 6,233,150 discloses a memory module having a memory card including a circuit board and a number of electronic components mounted on the circuit board. The memory module has, as a heat sink, a pair of covers arranged on mutually opposite surfaces of the circuit board and a pair of clamps that press the two covers onto the circuit board. In this case, each of the covers is thermally and electrically conductive and affords protection from electromagnetic radiation.

A complete heat sink of this type extends over all semiconductor devices of a memory module and thus thermally couples all of the semiconductor devices independently of their different power losses in a common housing. One disadvantage to this design is impermissible heating of adjacent semiconductor devices. A further disadvantage is the high material outlay, which thus increases the costs. Yet another disadvantage is that, in addition to producing the covers, it is also necessary to produce clamping elements in the form of clips, which increases the manufacturing costs.

U.S. Pat. No. 6,188,576 discloses a memory module having a housing cover in order to enclose a circuit board which has a plurality of individual semiconductor devices that dynamically generate a different quantity of heat. The housing cover provides a heat dissipation for the plurality of different memory chips. The different memory chips are thus thermally interconnected among one another via the circuit board and via corresponding solder balls. Besides the heat dissipation, the rigid housing protects both the circuit board and the chips.

In an embodiment disclosed in U.S. Pat. No. 6,188,576, a memory module includes a thermally conductive substance arranged within the housing cover in order to conduct heat from the individual chips to the housing cover. In this case, the covers have snap-action hooks which reach over the edges of the circuit board and clamp the covers onto the circuit board on both sides. In this design, there is the risk of impermissible heating of adjacent semiconductor devices which intrinsically generate a reduced power loss and are then impermissibly additionally heated by the heat distribution of the thermally conductive substance and the thermally conductive covers. Moreover, there is also the disadvantage of an increased material outlay, which increases manufacturing costs.

A further known heat sink design includes providing individual semiconductor devices directly with a heat sink, where the heat sink is adhesively bonded onto the rear side of the housing by means of a thermally conductive adhesive. Solutions of this type have the disadvantage that, in mechanical shock tests and in vibration tests and also in the case of other manual influences, an impermissibly high mechanical stress may be exerted on the devices to be cooled by virtue of the heat sink bonded on adhesively, which may result in damage to the semiconductor device.

SUMMARY OF THE INVENTION

It is an object of the invention to provide a heat sink for a semiconductor device that enables cooling of a product with a flip-chip semiconductor housing in accordance with a BGA (ball grid array) type with an open chip rear side, the semiconductor chip being mounted on the substrate of a memory module by its flip-chip contacts.

It is another object of the invention to provide such a heat sink for a semiconductor device in which the memory module is a DIMM (dual inline memory module) semiconductor device.

It is a further object of the invention to provide such a heat sink that permits the flip-chip housing to be hotter than the surrounding components in an operating state.

It is still another object of the invention to provide such a heat sink such that only individual semiconductor devices in the form of flip-chip housings are cooled by the heat sink, and where further components such as, for example, DRAMs, are not heated (or only heated to a reduced extent) by the heat generated by the flip-chip housings.

The aforesaid objects are achieved individually and/or in combination, and it is not intended that the present invention be construed as requiring two or more of the objects to be combined unless expressly required by the claims attached hereto.

In accordance with one embodiment of the present invention, a heat sink is provided for surface-mounted semiconductor devices on a main circuit board of an electronic module, preferably a modular memory device. The heat sink includes a three-dimensionally structured thermally conductive plate with a press-on region and with snap-action hooks. The snap-action hooks are arranged approximately at right angles with respect to the press-on region and are spring-elastically connected to the press-on region of the heat sink. The snap-action hooks are latched into place in passage openings of the circuit board with pressure generation of the press-on region onto a rear side of the surface-mounted semiconductor device. A plastically deformable, thermally conductive composition is arranged between the rear side of the semiconductor device and the press-on region of the heat sink as an intermediate layer.

In accordance with another embodiment of the invention, a mounting method for fitting a heat sink on a circuit board with at least one semiconductor device includes the following method steps. A surface-mountable semiconductor device with circuit substrate is oriented and positioned on the main circuit board with passage opening for snap-action hooks of the heat sink. In preparation, the plastically deformable composition is applied to be heat sink in its press-on region. A heat sink is subsequently taken up from a heat sink supply tray, the heat sink including snap-action hooks at right angles with respect to the press-on region, which, for its part, is spring-elastically connected to the snap-action hooks. The snap-action hooks of the heat sink are then aligned with the passage openings of the circuit board. Afterward, by exercising pressure, the snap-action hooks are latched into place with deformation of the ductile thermally conductive composition to form an intermediate layer between the heat sink and the rear side of the semiconductor device.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION OF THE PREFERRED EMBODIMENTS

In accordance with the invention, a heat sink is provided for surface-mounted semiconductor devices on a main circuit board of an electronic module, preferably a modular memory device. The heat sink includes a three-dimensionally structured thermally conductive plate with a press-on region and with snap-action hooks. The snap-action hooks are arranged approximately at right angles with respect to the press-on region and are spring-elastically connected to the press-on region of the heat sink. The snap-action hooks are latched into place in passage openings of the circuit board with pressure generation of the press-on region onto a rear side of the surface-mounted semiconductor device. A plastically deformable, thermally conductive composition is arranged between the rear side of the semiconductor device and the press-on region of the heat sink as an intermediate layer.

The following advantages are achieved by the both thermally and mechanically calculated and simulated design of the heat sink and by the design of the plastically deformable and thermally conductive composition:

1. The tolerances of the semiconductor device and the tolerances of the circuit board are largely compensated for by the embodiment of the spring-elastic connections of the heat sink and by the design and the properties of the plastically deformable and thermally conductive composition. This means that, given maximum dimensions with regard to the thickness of the semiconductor device to be cooled and the dimensions of the circuit board, as a result of the then increased spring force of the elastic connections of the heat sink, the plastically deformable and thermally conductive composition forms a thinner intermediate layer between press-on region and snap-action hooks. Given minimum dimensions, the ductile thermally conductive composition then behaves in the opposite fashion. This means that the plastically deformable and thermally conductive composition forms a thicker intermediate layer corresponding to the tolerances.

2. In the mounted state, the heat sink permits forced cooling air to contribute to the cooling on the entire surface of the heat sink and, in particular, also in regions of the underside of the heat sink. For the underside cooling, the spring-elastic connections to the snap-action hooks are formed in correspondingly planar fashion.

3. The heat sink is pressed and deformed in a defined manner in the course of mounting in order to introduce the snap-action hooks into the circuit board or into the passage openings in the circuit board. After mounting and the now released spring force of the elastic connection between press-on region and snap-action hooks, the press-on region holds securely on the semiconductor device housing and on the circuit board. In this case, the plastically deformable and thermally conductive composition is compressed to a thickness of the intermediate layer that compensates for the tolerances.

4. The snap-action hooks that reach through the fixing openings or passage openings of the circuit board anchor the heat sink reliably and securely. In this case, it has been shown that a fixed retention and no deformation of the heat sink result in shock tests up to 1500 g and vibration tests.

5. Utilizing support parts such as stop brackets on the heat sink, the latter can be spring-elastically prestressed only in a specific permissible region, so that the semiconductor device and the associated semiconductor chip are not damaged.

6. By virtue of an optimized design of the snap-action hooks, only a minimal fixing area is required in the circuit board so that the area for the wiring on the circuit board is only minimally reduced.

7. Since the heat sink constitutes a three-dimensionally structured thermally conductive plate, it is suitable for mass production and embodied in machine-mountable fashion.

8. The heat sink is easy to remove on account of the snap-action hooks and permits repair of the underlying semiconductor devices.

9. The heat sink enables repair of adjacent semiconductor devices, such as DRAMs, without removing the heat sink itself.

In one preferred embodiment of the invention, the plasticity of the plastically deformable composition is matched to the pressure in the press-on region for the elasticity of a spring-elastic connection between press-on region and snap-action hooks. This mechanically calculated and simulated construction makes it possible, as mentioned above, to enable compensation of minimum tolerances of the semiconductor devices in terms of their thickness by means of the intermediate layer and thus by means of the plastically deformable composition.

In a further embodiment of the invention, the passage openings through the circuit board are metal-coated. This has the advantage that, via the metal coating of the passage openings, the heat sink can be electrically connected to a ground potential and thus additionally has a shielding effect with respect to electromagnetic interference radiation.

In a further preferred embodiment of the invention, the heat sink has at least two snap-action hooks which are arranged in a manner situated opposite with respect to the press-on region. The planar compensation by the two snap-action hooks is achieved by the planar extent of the three-dimensionally structured thermally conductive plate from which the heat sink is formed.

In a further embodiment of the invention, the press-on region is quadrilated and is matched to the shape of the rear side of a surface-mounted semiconductor device, so that it preferably has four snap-action hooks, i.e. in each case one at each corner. In this embodiment of the invention, the press-on effect of the snap-action hooks is equalized, and helps to compensate for tolerances in the device thickness. In order to achieve a dimensionally stable and rigid press-on region, the three-dimensionally structured plate has an offset between the spring-elastic region of the heat sink and the press-on region. In this case, the offset forms the edges of the press-on region and thus provides for the dimensionally stable contour of the press-on region with respect to the spring-elastic structure of the plate-type heat sink, which extends from the press-on region as far as the snap-action hooks angled away at right angles from the press-on region.

The plastically deformable, readily thermally conductive composition preferably includes a silicone elastomer filled with aluminum oxide or boron nitride. In this case, the silicone elastomer undertakes the plastically deformable function while the thermal conduction is effected or improved by means of the aluminum oxide and boron nitride. In one preferred embodiment of the invention, the heat sink itself may include thermally conductive metal, such, as, for example, a copper alloy in the form of CuCrSiTi (Cr 0.3% by weight, Ti 0.1% by weight, Si 0.02% by weight, remainder copper with a thermal conductivity of 310 W/mK).

The metal used for the three-dimensionally structured thermally conductive plate used as a heat sink includes corresponding mechanical properties in order, on the one hand, to ensure the spring properties in the spring-elastic region, and, on the other hand, to have a corresponding dimensional stability in the press-on region. The mechanical properties preferably have a tensile strength >530 MPa and a 0.2% proof stress >460 MPa. The thermal contact area of the heat sink is formed by the abovementioned press-on region, which bears, after the mounting of the heat sink, on the rear side of the semiconductor device with anchoring of the snap-action hooks fixedly on the semiconductor device or on the intermediate layer made of plastically deformable thermally conductive material.

In an alternative embodiment of the invention, the plastically deformable composition is a metal alloy including metals having a low melting point, preferable indium, tin and/or lead. This mechanic composition has the advantage that it not only exhibits good thermal conductivity, but also constitutes a good connection electrically if the rear side of the semiconductor device is to be grounded.

In a further embodiment of the invention, the plastically deformable composition includes a plastic mixture with plasticizer additions and thermally conductive metal particles. In this case, the plasticizer additions ensure that the plastic becomes plastically deformable and thus ductile, and the conductive metal particles advantageously provide for the good thermal properties. Finally, it is also possible for the plastically deformable composition used to be a tough viscous metal paste, preferably an aluminum paste, which, on the one hand, is adapted to the tolerances of the semiconductor devices even at low pressure and, on the other hand, forms an ideal intermediate layer with thermally conductive properties.

In a further embodiment of the invention, the heat sink is constructed in one piece with press-on region and snap-action hooks. This has the advantage that the complete heat sink with press-on region, spring-elastic connecting region and snap-action hooks can be stamped out in one piece from a corresponding metal plate by means of a single stamping process.

In a further embodiment of the invention, the snap-action hooks have limbs which are reinforced by a stiffening bead and have stop corners that delimit the engagement region of the snap-action hooks. The stop corners are likewise arranged approximately at right angles on the limbs and are supported on the top side of the circuit board when the snap-action hooks are introduced into the opening of the circuit board, and thus limit the force which acts on the deformable thermally conductive composition between heat sink and semiconductor device.

In a further embodiment of the invention, the heat sink has stop brackets. This has the advantage that excessive tilting of the heat sink is thereby prevented and the semiconductor device or the semiconductor chip is not damaged by shock, vibration or incorrect handling.

In a further specific embodiment of the invention, the semiconductor device has a circuit substrate with surface-mountable contacts on its underside and a semiconductor chip with chip-contacts on its top side (i.e., a side opposing the underside). In this case, the snap-action hooks are in engagement with the openings of the circuit board. In this embodiment of the invention, due to the press-on region of the heat sink and the ductile composition arranged in between, a pressure is implemented on the rear side of the semiconductor chip and a regular distribution of the thermally conductive composition is achieved on the rear side of the semiconductor device. The magnitude of the pressure or of the force on the deformable composition depends on the spring elasticity of the connecting region of the heat sink and may be dimensioned in such a way as to obtain an optimum thermal coupling of heat sink and semiconductor device taking account of the tolerances of the components of the semiconductor device involved and simultaneous deformation of the ductile thermally conductive composition.

While it is possible, on the one hand, for the external contacts of the semiconductor device to be surface-mounted on the main circuit board by soldering connections, in a further aspect of the invention it is possible to coordinate the spring force of the heat sink and the deformability of the ductile composition with one another in such a way that the surface-mountable contacts on the underside of the circuit substrate of the semiconductor device form a pressure contact or a pressure contact connection to corresponding contact pads of the circuit board. Consequently, it emerges in a further embodiment of the invention that the surface-mountable contacts of the circuit substrate have pressure contact connections to contact pads of the main circuit board, the contact pressure being applied to the surface-mountable contacts by the stop brackets and the press-on region.

The invention relates not only to the heat sink but also to semiconductor devices which are provided with a heat sink of this type. Furthermore, the invention also relates to semiconductor modules, in particular memory modules in DIMM technology (dual inline memory module technology), which may have individual or a plurality of heat sinks of this type.

The abovementioned pressure contact connection has the further advantage over soldering or adhesively bonding the surface-mountable contacts in place that fewer shear stresses act on the surface-mountable contacts during cyclic thermal loading. The reliability of the semiconductor devices is thus increased by virtue of this mounting on the circuit board.

The effectiveness of the novel heat sink for memory modules was verified with the aid of simulation methods and wind tunnel experiments.

TABLE 1

| $T_{ambient} = 55°$ C. | | | Thickness: 0.3 mm | | | Thickness: 0.5 mm | | |
|---|---|---|---|---|---|---|---|---|
| $V_{air} = 1/5$ m/s | | | $\lambda = 120$ W/mK | $\lambda = 243$ W/mK | $\lambda = 310$ W/mK | $\lambda = 120$ W/mK | $\lambda = 243$ W/mK | $\lambda = 310$ W/mK |
| Area of the semi-conductor chip: 62.25 mm³ | laminar | $T_{max}$ (AMB) | 103 | 100 | 99 | 100 | 98 | 97 |
| | | $T_{max}$ (DRAM) | 96 | 96 | 96 | 96 | 96 | 96 |
| | turbulent | $T_{max}$ (AMB) | 98 | 95 | 94 | 95 | 93 | 92 |
| | | $T_{max}$ (DRAM) | 88 | 88 | 88 | 88 | 88 | 88 |

A mounting method for fitting a heat sink on a circuit board with at least one semiconductor device includes the following method steps. Firstly, a surface-mountable semiconductor device with circuit substrate is oriented and positioned on the main circuit board with passage opening for snap-action hooks of the heat sink. In preparation, the plastically deformable composition is applied to be heat sink in its press-on region. A heat sink is subsequently taken up from a heat sink supply tray, the heat sink having snap-action hooks at right angles with respect to the press-on region, which, for its part, is spring-elastically connected to the snap-action hooks. The snap-action hooks of the heat sink are then aligned with the passage openings of the circuit board.

Afterward, by exercising pressure, the snap-action hooks are latched into place with deformation of the ductile thermally conductive composition to form an intermediate layer between the heat sink and the rear side of the semiconductor device.

This method has the advantage that, with few automatic handling processes, the heat sink can be arranged and anchored on corresponding positions in a semiconductor memory module and, at the same time, an intensive thermal coupling between heat sink and semiconductor device can be produced by means of the ductile thermally conductive composition. One variant of the method has the advantage that soldering the surface contacts of the semiconductor device or of the circuit substrate onto the circuit board may possibly be dispensed with if the contact pressure exerted on the press-on region of the heat sink suffices to fix the surface-mountable contacts in their position on the contact pads of the circuit board by means of the forces of the anchored snap-action hooks and the connecting region between snap-action hooks and press-on region. However provision is primarily made for soldering the surface-mountable contacts on the contact pads of the circuit board, so that extreme loads can be transmitted. Furthermore, it is possible for the surface-mountable contacts to be adhesively bonded onto the contact pads of the circuit board using a conductive adhesive.

Table 1 shows the results of a thermal simulation during which a heat sink having an overall height of 3.49 mm was tested. The test was carried out at an ambient temperature $T_{ambient}=55°$ C. and at an air velocity $V_{air}=1.5$ m/s in a wind tunnel. The area of the rear side of the semiconductor chip on which the heat sink is pressed with its press-on region by means of an intermediate layer made of a plastically deformable and thermally conductive composition is 62.25 mm². The tests were carried out using three-dimensionally structured plates as heat sinks having a thickness of 0.3 mm and, in comparison therewith, a thickness of 0.5 mm.

The maximum temperatures at the AMB devices provided with a heat sink and the maximum temperatures at the DRAMs not equipped with cooling areas are measured for different thermal conductivities $\lambda$ of the cooling materials. The thermal conductivities were varied in three stages with $\lambda=120$ W/mK, 243 W/mK and 310 W/mK. It can be seen in this case that the maximum temperature of the AMB devices provided with heat sinks decreases as the thermal conductivity increases, to be precise from 103° C. to 99° C. The heat sinks comprising a wall thickness of 0.5 mm result in correspondingly lower maximum temperatures for the AMB devices of between 100 and 97° C.

The DRAMs without a heat sink were able to be kept constant at 96° C. during laminar air flow and constant at 88° C. during turbulent flow even though the AMB devices with their increased power losses are arranged adjacent to the DRAMs on a circuit board.

If the ambient temperature is increased by a few degrees to 60° C. and if, at the same time, a thickness between the two thicknesses specified in the table, of 0.4 mm, is assumed, a maximum temperature of the AMB devices of 98° C. results in the simulation, given a highest thermal conductivity value of 310 W/mK and turbulent flow.

It could thus be shown that an effective cooling by the heat sinks of individual semiconductor devices is possible without the temperature of the adjacent DRAM devices being adversely influenced thereby.

Exemplary embodiments of heat sinks incorporated with semiconductor devices in accordance with the invention are illustrated in FIGS. 1–10.

Figure 1:
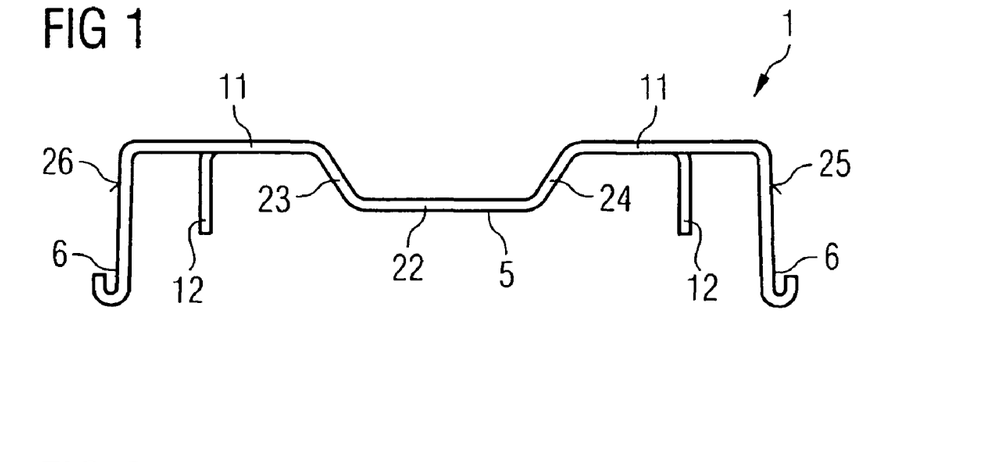
FIG. 1 shows a schematic cross section through a heat sink of one embodiment of the invention.

FIG. 1 shows a schematic cross section through a heat sink 1 of one embodiment of the invention. The heat sink 1 is shown in profile here and has a press-on region 5 at its center and two spring-elastic connecting regions 11 on each side of the press-on region 5. In this embodiment of the invention, the press-on region 5 has a well contour with a plane bottom 22 and raised-up edges 23 and 24. These edges 23 and 24 merge with the connecting regions 11, at which snap-action hooks 6 are arranged virtually perpendicularly. Snap-action hooks 6 can engage in passage openings of a circuit board (not shown) and be anchored on the circuit board, so that the press-on region 5 can be pressed by its bottom 22 onto the rear side of a semiconductor device (not shown) and be fixed there. Moreover, stop brackets 12 are arranged in a manner angled away perpendicularly with respect to the connecting regions 11, and prevent excessive tilting of the heat sink.

Figure 2:
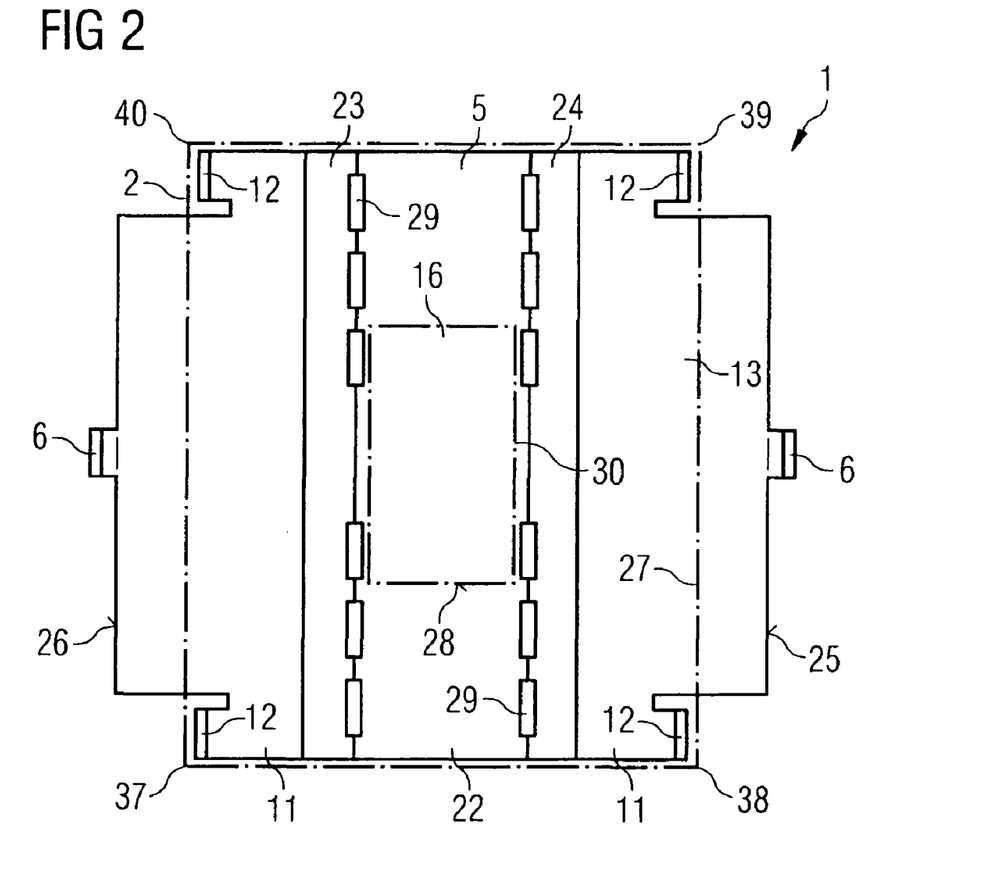
FIG. 2 shows a schematic plan view of the heat sink of FIG. 1.

FIG. 2 shows a schematic plan view of the heat sink 1 of FIG. 1. This plan view reveals that two snap-action hooks 6 are arranged relatively centrally on mutually opposite sides 25 and 26 of the heat sink 1. The dashed-dotted line 27 shows the outer contour of the semiconductor device 2 having a circuit substrate 13, on which a semiconductor chip 16 is situated, the edges 30 of which are identified by a dashed-dotted line 28. The contours of the semiconductor chip 16 lie within the bottom 22 of the press-on region 5 of the heat sink 1. The heat sink 1 includes, in the spring-elastic connecting regions 11, four stop brackets 12 in the four corners 37, 38, 39 and 40, in order to limit tilting of the heat sink and in order to avoid damage to the semiconductor chip.

At the center of the heat sink 1, the press-on region 5 exerts a pressure on the plastically deformable composition (not visible in FIG. 2), which propagates under pressure over the whole area on the rear side of a semiconductor device and produces a good thermal transition from the heat sink 1 in the press-on region 5 to the semiconductor chip. The heat sink 1 has slots 29 at the edges of the press-on region, and the slots render a compliant transition from the press-on region 5 to the spring-elastic connecting region 11.

Figure 3:
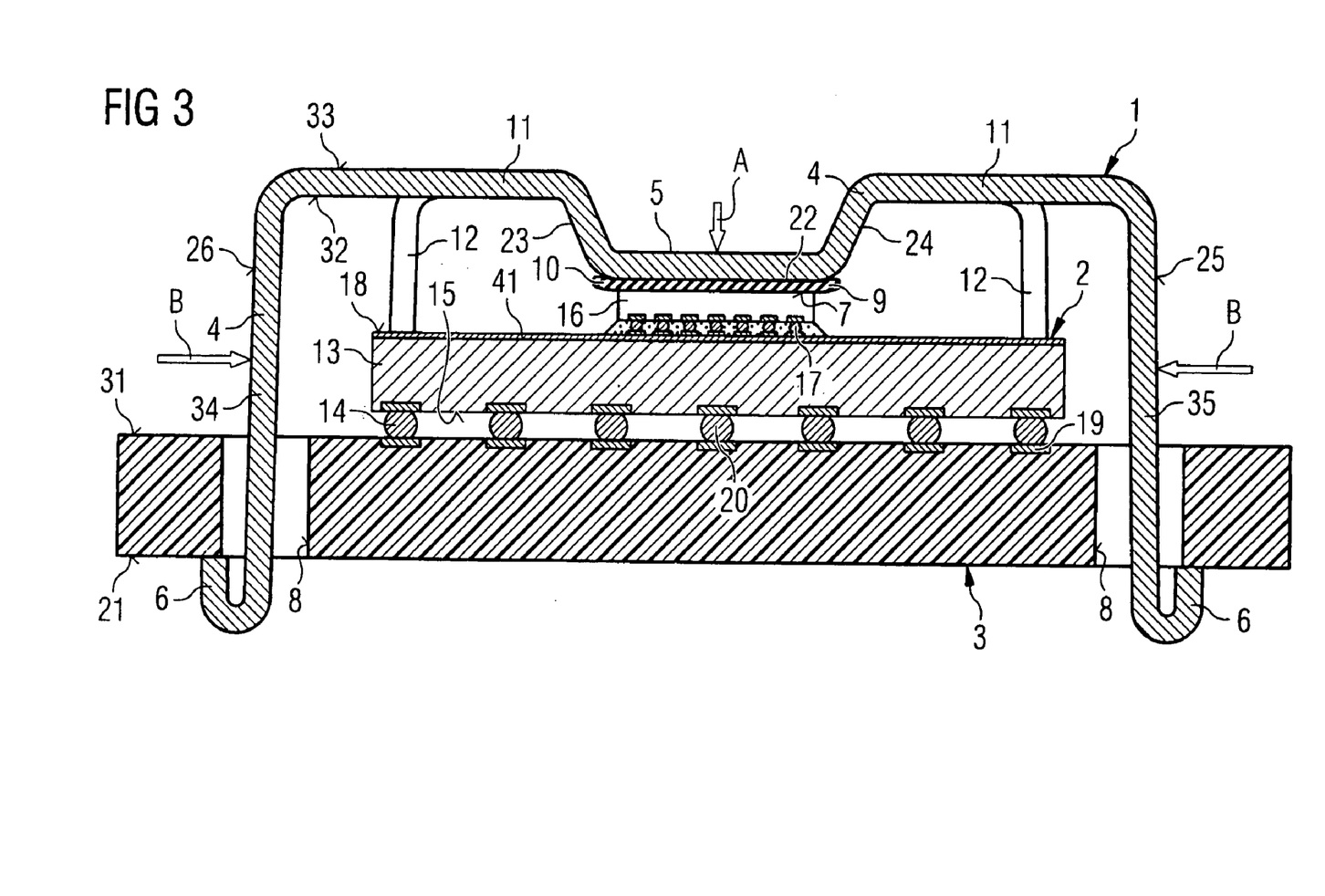
FIG. 3 shows a schematic cross section through a semiconductor device connected with the heat sink of FIG. 1, where the heat sink deforms a ductile thermally conductive material upon placement onto a circuit board of the semiconductor device.

FIG. 3 shows a schematic cross section through a semiconductor device 2, which is pressed onto a circuit board 3 by the heat sink 1 of FIG. 1. The semiconductor device 3 has a BGA construction. In the embodiment of FIG. 3, the semiconductor device includes a circuit substrate 13, a wiring structure 41 disposed on the top side 18 of the substrate 13, and surface-mountable contacts 14 on the underside 15 of the substrate 13. The surface-mountable contacts 14 on the underside 15 are electrically connected to the wiring structure 41 on the top side 18 of the circuit substrate 13. A semiconductor chip 16 is arranged on the top side 18 of the circuit substrate 13, and is electrically connected via flip-chip contacts 17 to the wiring structure 41 on the top side 18 of the wiring substrate 13.

A contact pressure of the press-on region 5 acts on the rear side 7 of the semiconductor chip 16 in arrow direction A. A plastically deformable thermally conductive composition 9 is arranged between the press-on region 5 of the heat sink 1 and the rear side 7 of the semiconductor chip 16, which composition forms an intermediate layer 10 and compensates for tolerances in the thickness of the semiconductor chip 16 and also in the thickness of the circuit substrate 13 and also in the height of the surface-mounted contacts 14. Moreover, the intermediate layer 10 ensures the thermal contact between the rear side 7 of the semiconductor chip 16 and the heat sink 1. In this embodiment of the invention, this ductile composition 9 includes a silicone elastomer filled with aluminum oxide and boron nitride. In this case, the aluminum oxide and the boron nitride provide for a good thermal conductivity and the silicone elastomer provides for the ductility of this composition of the intermediate layer 10.

The heat sink 1 is a three-dimensionally structured thermally conductive plate 4 that includes, in addition to the press-on region 5, connecting regions 11 on both sides of the press-on region 5. The connection regions 11 are spring-elastic and merge with snap-action hooks 6 arranged generally vertically with respect to the connecting region 11 and with respect to the press-on region 5. The snap-action hooks 6 are arranged only on short side sections of the heat sink 1. They extend through passage openings 8 of the circuit board 3 on the top side 31 of which the semiconductor device 2 is arranged, and are in engagement with the underside 21 of the circuit board 3. The circuit board 3 has a printed circuit for a semiconductor module. The remaining devices of the semiconductor module are not shown here. However, these remaining devices may or may not include a heat sink of the type depicted in FIG. 3. In particular, in cases where the power loss of a remaining component is not very high (e.g., as is the case for DRAMs), a heat sink 1 of this type is omitted for such remaining component.

The cross section through the mounted heat sink 1 on the circuit board 3 shows that, in the case of a moving cooling medium, such as air, cooling medium actively sweeps around both the underside 32 and the top side 33 of the heat sink 1. In this embodiment of the invention, the material of the heat sink 1 includes a readily conductive copper alloy CuCrSiTi (including Cr 0.3% by weight, Ti 0.1% by weight, Si 0.02% by weight and the remainder copper). This copper alloy has a thermal conductivity of 310 W/mK, and has a tensile strength that is greater than 530 MPa. The 0.2% proof stress lies above 460 MPa. These mechanical properties with regard to the tensile strength and the proof stress make it possible also to form the connecting regions 11 with their spring-elastic properties from a sheet-metal plate of this material, where a plate thickness of between 0.3 and 0.5 mm is preferable. The intermediate layer 10 made of a ductile thermally conductive material 9 makes it possible to provide a thermal contact resistance of approximately 10 to 11 K/W between the rear side 7 of the semiconductor chip 16 and the ambient air of the heat sink 1.

Figure 4:
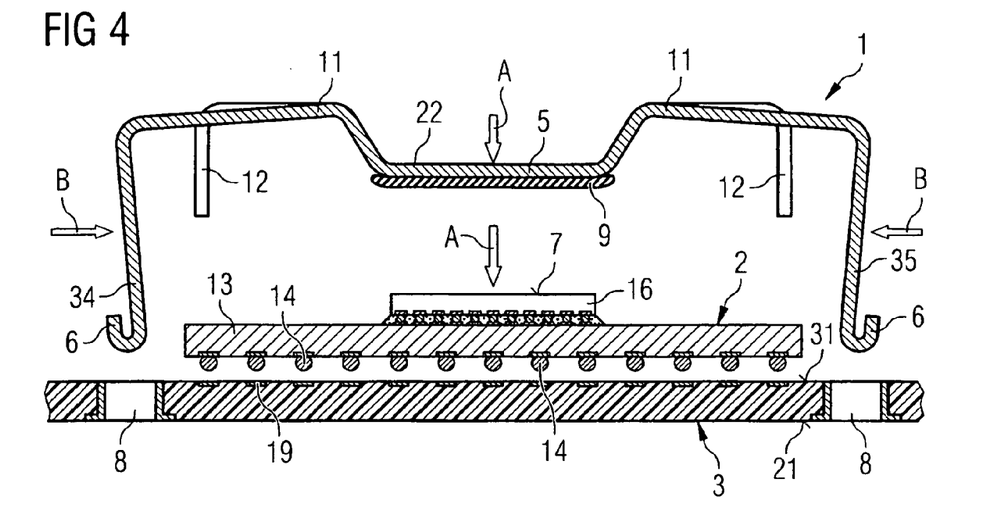
FIG. 4 shows a schematic cross section through the heat sink with spring-elastic deformation when the snap-action hooks are introduced into passage openings of the circuit board.

FIG. 4 shows a schematic cross section through the heat sink 1 with spring-elastic deformation when the snap-action hooks 6 are introduced into the passage openings 8 of a circuit board 3. For this purpose, the limbs 34 and 35 of the snap-action hooks 6 are compressed in arrow direction B, so that they can be led through the passage openings 8 of the circuit board 3. For this purpose, the heat sink 1 is lowered in arrow direction A and, at the same time, a pressure is exerted on the rear side 7 of the semiconductor chip 16 and the semiconductor device 2 is pressed with its contacts 14 onto the top side 31 of the circuit board 3 with its contact pads 19.

Figure 5:
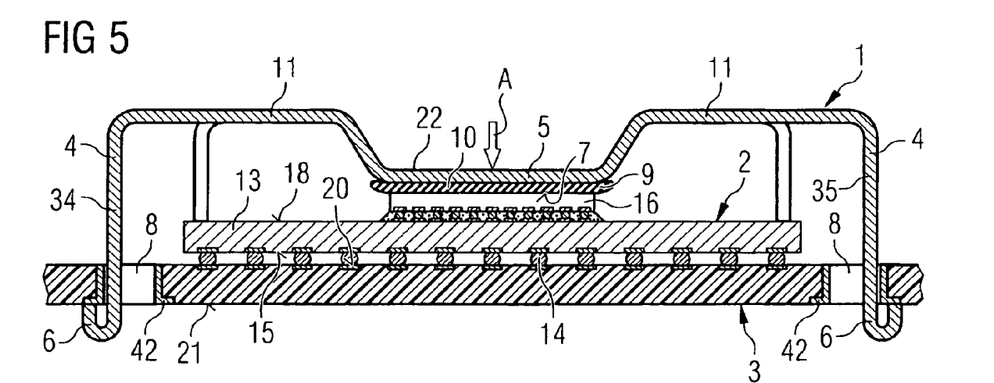
FIG. 5 shows a schematic cross section through the heat sink of FIG. 4 after the snap-action hooks have been anchored.

FIG. 5 shows a schematic cross section through the heat sink 1 after the snap-action hooks 6 have been anchored on the underside 21 of the circuit board 3. The passage openings 8 are metallized in this embodiment of the invention, so that there is the possibility of connecting the heat sink 1 to a ground potential with the aid of the metal layer 42 of the passage openings 8. The spring force of the connecting regions 11 provides for the contact pressure in arrow direction A in the press-on region 5 of the heat sink 1 on the semiconductor device 2. As a result of the contact pressure, the plastically deformable composition 9 is spread out over the whole area on the rear side 7 of the semiconductor chip 16 and produces a good thermal transition from the heat sink 1 to the semiconductor chip 16.

Figure 6:
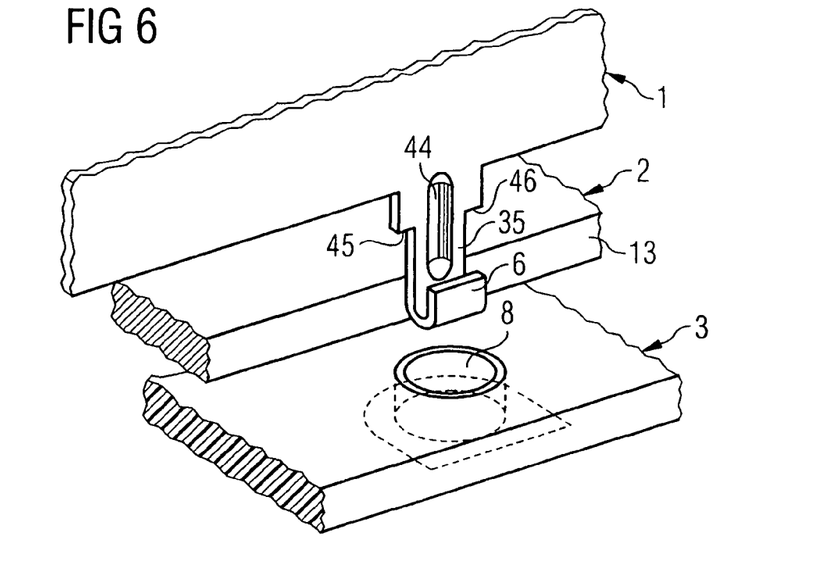
FIG. 6 shows a schematic partial view in perspective of a heat sink with two snap-action hooks, one of the snap-action hooks being shown prior to introduction into a passage opening.

FIG. 6 shows a schematic perspective view of a heat sink 1 with two snap-action hooks 6, where one of the snap-action hooks 6 is depicted in FIG. 6 just prior to introduction into a passage opening 8. The circuit substrate 13 of the semiconductor device 2 can furthermore be seen schematically. The limb 35 of the snap-action hook 6 has a stiffening bead 44, which prevents warping of the limb 35 in the event of shock or vibration loading. Moreover, two stop corners 45 and 46 are provided on the limb 35, and prevent, during the mounting of the heat sink 1, the limb from entering too far into opening 8 in the circuit board 3 and from deforming the thermally conductive ductile composition to an excessively great extent in the process. The final thickness of the ductile composition is set by the spring force present in the heat sink.

Figure 7:
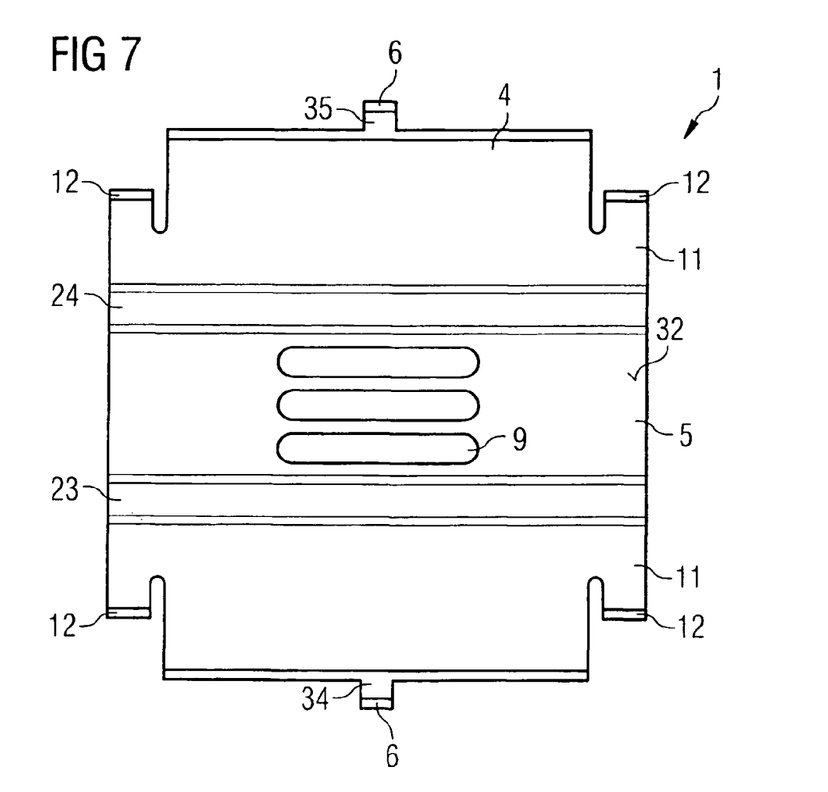
FIG. 7 shows a schematic bottom view of the heat sink of FIG. 1 with a ductile thermally conductive composition having been applied.

FIG. 7 shows a schematic bottom view of the heat sink 1 of FIG. 1 with a ductile thermally conductive composition 9 having been applied. The composition 9 is applied to the underside 32 in the positional region of the semiconductor chip before the heat sink 1 is fixed on the circuit board (not shown) with the aid of the snap-action hooks 6.

Figure 8:
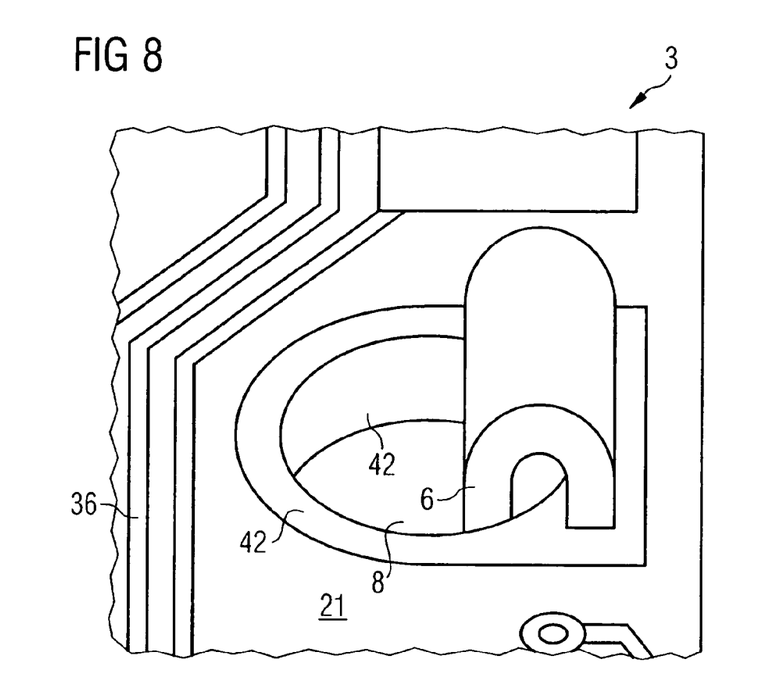
FIG. 8 shows a schematic partial view in perspective of the underside of a circuit board after a snap-action hook has been locked.

FIG. 8 shows a schematic partial perspective bottom view of the underside 21 of the circuit board 3 after a snap-hook 6 has been locked. The passage opening 8 includes a metal layer 42, so that the metal of the snap-action hook 6 forms a pressure contact with the metal layer 42 of the passage opening 8. Furthermore, wiring structure 36 can be seen on the underside 21 of the circuit board 3.

Figure 9:
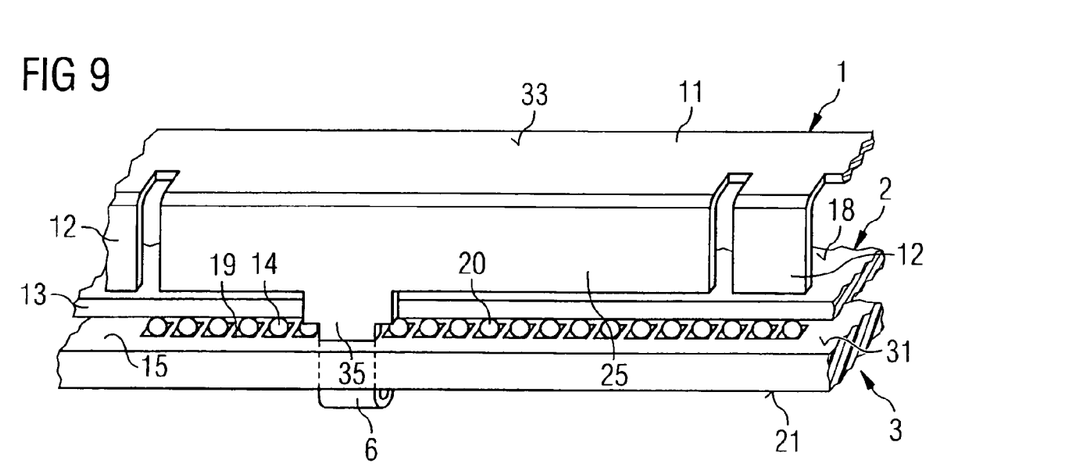
FIG. 9 shows a schematic partial side view of the heat sink with locked snap-action hook and stop bracket.

FIG. 9 shows a schematic partial side view of the heat sink 1 with a locked snap-action hook 6 in the circuit board 3 and stop brackets 12. The stop brackets 12 prevent tilting of the heat sink 1 and damage to the semiconductor device.

Figure 10:
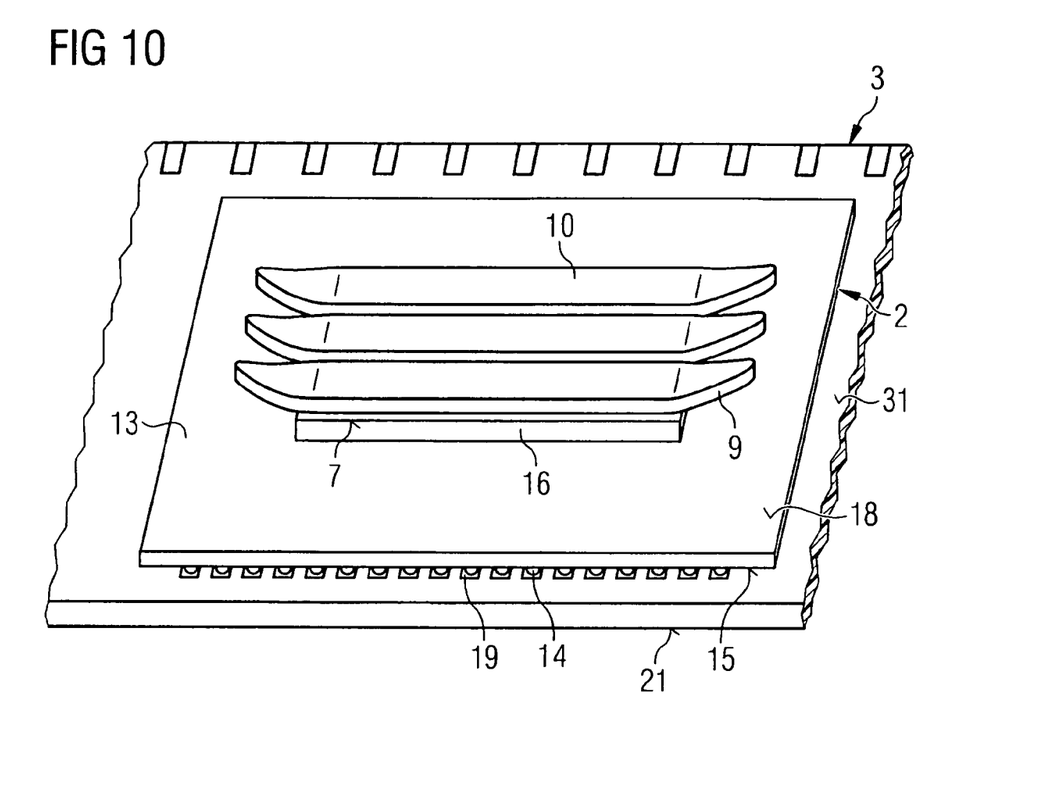
FIG. 10 shows a partial view in perspective of the rear side of a semiconductor chip with a deformed thermally conductive ductile composition after removal of the heat sink.

FIG. 10 shows a partial view in perspective of the rear side 7 of a semiconductor chip 16 with a ductile intermediate layer 10 being applied. In order to show this illustration, the heat sink with its press-on region has been removed. It can clearly be discerned that the ductile thermally conductive composition 9 completely covers the rear side 7 of the semiconductor chip 16 as a result of the exerted pressure of the heat sink. Tolerances in the thickness variation both of the semiconductor chip 16 and of the circuit substrate 13 and also in the height of the contacts 14 on the underside 15 of the circuit substrate 13 are compensated for by this ductile thermally conductive composition 9.

LIST OF REFERENCE SYMBOLS

1 Heat sink
2 Surface-mountable semiconductor device
3 main circuit board
4 Structured plate
5 Press-on region
6 Snap-action hook
7 Rear side of the semiconductor device
8 Passage opening in the circuit board
9 Plastically deformable composition
10 Intermediate layer
11 Resilient connection
12 Stop bracket
13 Circuit substrate
14 Surface-mountable contacts of the circuit substrate
15 Underside of the circuit substrate
16 Semiconductor chip
17 Flip-chip contacts
18 Top side of the circuit substrate
19 Contact pads of the circuit board
20 Soldering contact
21 Underside of the circuit board
22 Bottom of the heat sink
23 Raised-up edge
24 Raised-up edge
25 Side of the heat sink
26 Side of the heat sink
27 Dash-dotted line
28 Double-dotted line
29 Slot
30 Edges of the semiconductor chip
31 Top side of the circuit board
32 Underside of the heat sink
33 Top side of the heat sink
34 Limb of the snap-action hook with stop
35 Limb of the snap-action hook with stop
36 Wiring structure
37 Corner of the circuit substrate
38 Corner of the circuit substrate
39 Corner of the circuit substrate
40 Corner of the circuit substrate
41 Wiring structure on the top side of the circuit substrate
42 Metal layer
43 Stiffening bead
44 Stiffening bead
45 Stop corners
46 Stop corners
A Arrow direction
B Arrow direction

What is claimed is:

1. A heat sink for surface-mounted semiconductor devices on a main circuit board of an electronic module including a surface-mounted semiconductor device, the heat sink comprising a three-dimensionally structured thermally conductive plate with a press-on region and with snap-action hooks, the snap-action hooks being resiliently connected to the press-on region of the heat sink and being configured for latching, with pressure generation of the press-on region onto a rear side of the surface-mounted semiconductor device, into corresponding passage openings of the circuit board, the snap-action hooks further comprising limbs including stop corners that limit the engagement of the snap-action hooks with the passage openings of the circuit board, and a plastically deformable thermally conductive composition disposed on the heat sink and being arranged to form an intermediate layer between the rear side of the surface-mounted semiconductor device and the press-on region of the heat sink.

2. The heat sink of claim 1, wherein a spring-elastic connection is disposed between the press-on region and each of the snap-action hooks such that the plastically deformable composition is capable of elastic deformation upon application of a pressure applied in the press-on region.

3. The heat sink of claim 1, wherein the heat sink further comprises a thermally conductive copper alloy.

4. The heat sink of claim 3, wherein the conductive copper alloy comprises 0.3% by weight of chromium, 0.1% by weight of titanium, 0.02% by weight of silicon and the remainder copper.

5. The heat sink of claim 1, wherein the heat sink further comprises at least two snap-action hooks that are arranged on opposite sides of the press-on region.

6. The heat sink of claim 1, wherein the press-on region includes a quadrilateral geometry that matches the geometric shape of the rear side of the surface-mounted semiconductor device and the heat sink comprises four snap-action hooks.

7. The heat sink of claim 1, wherein the plastically deformable composition comprises a silicone elastomer filled with aluminum oxide and boron nitride.

8. The heat sink of claim 1, wherein the plastically deformable composition comprises a plastic mixture with plasticizer additions and thermally conductive metal particles.

9. The heat sink according to claim 1, wherein the plastically deformable composition comprises a metal paste.

10. The heat sink of claim 9, wherein the metal paste comprises an aluminum paste.

11. The heat sink of claim 1, wherein the heat sink consists of a single piece including the press-on region and snap-action hooks.

12. The heat sink of claim 1, wherein the heat sink includes stop brackets extending from portions of the heat sink and configured to limit tilting of the heat sink when the snap-action hooks are latched into corresponding passage openings of the circuit board.

13. The heat sink of claim 1, wherein the force generated by the heat sink upon the snap-action hooks being latched into corresponding passage openings of the circuit board effects the deformation of the plastically deformable thermally conductive composition to form the intermediate layer.

14. A semiconductor device mounted on a circuit board, wherein the semiconductor device comprises the heat sink of claim 1.

15. The semiconductor device of claim 14, wherein the semiconductor device includes a circuit substrate with surface-mountable contacts disposed on an underside of the semiconductor device and a semiconductor chip with flip-chip contacts disposed on a top side of the semiconductor device, the surface-mountable contacts of the circuit substrate including soldering connections to contact pads of the circuit board.

16. A semiconductor module on a circuit board, wherein the semiconductor module comprises the heat sink of claim 1.

17. A semiconductor system comprising:
a circuit board;
a semiconductor device mounted on the circuit board; and
a heat sink comprising a three-dimensionally structured thermally conductive plate with a press-on region and with snap-action hooks, the snap-action hooks comprising limbs including stop corners that limit the engagement of the snap-action hooks with passage openings of the circuit board, the snap-action hooks further being resiliently connected to the press-on region of the heat sink and being configured for latching into place, with pressure generation of the press-on region onto a rear side of the semiconductor device, into corresponding passage openings of the circuit board, and a plastically deformable thermally conductive composition disposed on the heat sink and being arranged to form an intermediate layer between the rear side of the semiconductor device and the press-on region of the heat sink.

18. A method for mounting a heat sink on a circuit board including at least one semiconductor device, comprising:
positioning the semiconductor device with a circuit substrate on the circuit board, the circuit board including passage openings;
applying a plastically deformable composition to the heat sink in a press-on region of the heat sink, the heat sink including snap-action hooks that are resiliently connected to the press-on region;
aligning the snap-action hooks of the heat sink with the passage openings of the circuit board;
latching the snap-action hooks into the passage openings so as to deform the plastically deformable composition, the deformed composition forming an intermediate layer between the heat sink and a rear side of the semiconductor device, wherein the snap-action hooks include limbs that limit the latching engagement of the snap-action hooks with the passage openings.

19. A heat sink for surface-mounted semiconductor devices on a main circuit board of an electronic module including a surface-mounted semiconductor device, the heat sink comprising a three-dimensionally structured thermally conductive plate with a press-on region and with snap-action hooks, the snap-action hooks being resiliently connected to the press-on region of the heat sink and being configured for latching, with pressure generation of the press-on region onto a rear side of the surface-mounted semiconductor device, into corresponding passage openings of the circuit board, stop brackets extending from portions of the heat sink and configured to limit tilting of the heat sink when the snap-action hooks are latched into corresponding passage openings of the circuit board, and a plastically deformable thermally conductive composition disposed on the heat sink and being arranged to form an intermediate layer between the rear side of the surface-mounted semiconductor device and the press-on region of the heat sink.

* * * * *